(12) United States Patent
Niculae et al.

(10) Patent No.: US 8,450,977 B2
(45) Date of Patent: May 28, 2013

(54) POWER MANAGEMENT SYSTEMS WITH CHARGE PUMPS

(75) Inventors: Marian Niculae, San Jose, CA (US); Alexandru Hartular, San Jose, CA (US); Dan Simion, Santa Clara, CA (US); Guoying Yi, Milpitas, CA (US)

(73) Assignee: O2Micro, Inc., Santa Clara, CA (US)

( * ) Notice: Subject to any disclaimer, the term of this patent is extended or adjusted under 35 U.S.C. 154(b) by 538 days.

(21) Appl. No.: 12/336,783

(22) Filed: Dec. 17, 2008

(65) Prior Publication Data

US 2009/0160500 A1 Jun. 25, 2009

Related U.S. Application Data

(60) Provisional application No. 61/008,427, filed on Dec. 20, 2007.

(51) Int. Cl.
*H02J 7/00* (2006.01)
(52) U.S. Cl.
USPC .......................................... 320/136; 320/134
(58) Field of Classification Search
None
See application file for complete search history.

(56) References Cited

U.S. PATENT DOCUMENTS

| | | | |
|---|---|---|---|
| 5,898,234 A * | 4/1999 | Kitagawa | 307/48 |
| 6,236,122 B1 | 5/2001 | Maeda et al. | |
| 6,465,984 B2 * | 10/2002 | Fukuoka et al. | 320/112 |
| 6,989,981 B2 | 1/2006 | Popescu-Stanesti et al. | |
| 7,202,634 B2 | 4/2007 | Bucur | |
| 7,203,048 B2 | 4/2007 | Shyr et al. | |
| 7,598,707 B2 | 10/2009 | Yamamoto | |
| 2005/0116697 A1 | 6/2005 | Matsuo et al. | |
| 2006/0202737 A1 | 9/2006 | Walter | |
| 2006/0255768 A1 * | 11/2006 | Yoshio | 320/134 |
| 2009/0102432 A1 | 4/2009 | Hsieh et al. | |

OTHER PUBLICATIONS

Storti, S.; Consiglieri, F.; Paparo, M.;, "A 30-A 30-V DMOS Motor Controller and Driver", Solid-State Circuits, IEEE Journal of, vol. 23, No. 6, pp. 1394-1401, Dec. 1988.
Tanzawa, T.; Tanaka, T.;, "A dynamic analysis of the Dickson charge pump circuit," Solid-State Circuits, IEEE Journal of, vol. 32, No. 8, pp. 1231-1240, Aug. 1997.
Sawada, K.; Sugawara, Y.; Masui, S.;, "An on-chip high-voltage generator circuit for EEPROMs with a power supply voltage below 2V", VLSI Circuits, 1995. Digest of Technical Papers., 1995 Symposium on, vol., no., pp. 75-76, Jun. 8-10, 1995.
Cho, T.B.; Gray, P.R.;, "A 10-bit, 20-MS/s, 35-mW pipeline A/D converter," Custom Integrated Circuits Conference, 1994., Proceedings of the IEEE 1994, vol., no., pp. 499-502, May 1-4, 1994.
Jieh-Tsorng Wu; Kuen-Long Chang;, "MOS charge pumps for low-voltage operation," Solid-State Circuits, IEEE Journal of, vol. 33, No. 4, pp. 592-597, Apr. 1998.
Favrat, P.; Deval, P.; Declercq, M.J.; "A high-efficiency CMOS voltage doubler," Solid-State Circuits, IEEE Journal of , vol. 33, No. 3, pp. 410-416, Mar. 1998.

* cited by examiner

*Primary Examiner* — Edward Tso
*Assistant Examiner* — Robert Grant

(57) ABSTRACT

A driving circuit for an N-channel Metal Oxide Semiconductor (NMOS) transistor can include a charge pump unit and a driver coupled to the charge pump. The charge pump can receive a source voltage and output an output voltage higher than the source voltage, where the source voltage is applied to a source terminal of the NMOS transistor. The driver receives the output voltage of the charge pump unit and converts the output voltage to a driving voltage operable for conducting the NMOS transistor.

14 Claims, 4 Drawing Sheets

POWER MANAGEMENT SYSTEMS WITH CHARGE PUMPS

RELATED APPLICATION

This application claims priority of provisional application, Ser. No. 61/008,427, filed on Dec. 20, 2007, which is hereby incorporated by reference in its entirety.

TECHNICAL FIELD

This invention relates to power management systems, and more particularly, to power management systems with charge pumps.

BACKGROUND

In present power management devices, such as power management controllers and/or chargers, switches can be used to direct power, e.g., direct power from a power source to a system load or to a rechargeable battery pack. In power management controllers or chargers, switches are generally implemented by bipolar transistors or Metal-Oxide-Semiconductor Field Effect transistors (MOSFETs). In electrical circuitries, ideal switches which are defined as having zero ON-state resistances and infinite OFF-state resistances are desired. MOSFETs can have relatively lower ON-state resistances and relatively higher OFF-state resistances than other types of switches.

Generally, a P-channel MOSFET (PMOS) switch may be driven in an ON state by biasing a gate terminal voltage of the PMOS switch to a low voltage level (e.g., 0 volt) with respect to the voltage on a source terminal of the switch. To turn on an N-channel MOSFET (NMOS) switch, a driving voltage at a gate terminal of the NMOS switch may need to be substantially greater than a source voltage at the source terminal (e.g., 5 volts greater than the source voltage). In conventional circuitries, the source terminal of an NMOS switch may be coupled to a positive terminal (or an output) of a power source (e.g., a battery pack). Therefore, the driving voltage for the gate of the NMOS switch may need to be substantially greater than the output voltage of the power source. This intrinsic characteristic of NMOS switches can limit their applications since such a high driving voltage may not be available. Consequently, PMOS switches are used extensively in current power management devices.

Although easier to drive, PMOS switches may have substantially larger ON-state resistances than NMOS switches having the same sizes as PMOS switches. For example, the ON-state resistance of a PMOS switch can be two times larger than the ON-state resistance of an NMOS switch having the same size. Accordingly, power dissipation of switches can be doubled if PMOS switches are employed instead of NMOS switches.

To reduce power dissipation of PMOS switches and obtain targeted power transfer efficiencies, PMOS switches with low ON-state resistance may be employed. However, such PMOS switches are costly as they may need a special fabrication process. Furthermore, such PMOS switches may also need extra chip area to accommodate drivers to drive them. Therefore, costs of such power management devices are increased.

SUMMARY

According to one embodiment of the invention, a driving circuit for an N-channel Metal Oxide Semiconductor (NMOS) transistor includes a charge pump unit and a driver coupled to the charge pump. In such an embodiment, the charge pump receives a source voltage and outputs an output voltage higher than the source voltage, and the driver receives the output voltage of the charge pump unit and converts the output voltage to a driving voltage operable for conducting the NMOS transistor.

BRIEF DESCRIPTION OF THE DRAWINGS

The accompanying drawings, which are incorporated in and from a part of this specification, illustrate embodiments of the present invention and, together with the description, serve to explain the principles of the invention.

DETAILED DESCRIPTION

Reference will now be made in detail to the embodiments of the present invention. While the invention will be described in conjunction with these embodiments, it will be understood that they are not intended to limit the invention to these embodiments. Additional advantages and aspects of the present disclosure will become readily apparent to those skilled in the art from the following detailed description. As will be described, the present disclosure is capable of modification in various obvious respects, all without departing from the spirit of the present disclosure. Accordingly, the drawings and description are to be regarded as illustrative in nature, and not as limitative.

Figure 1:
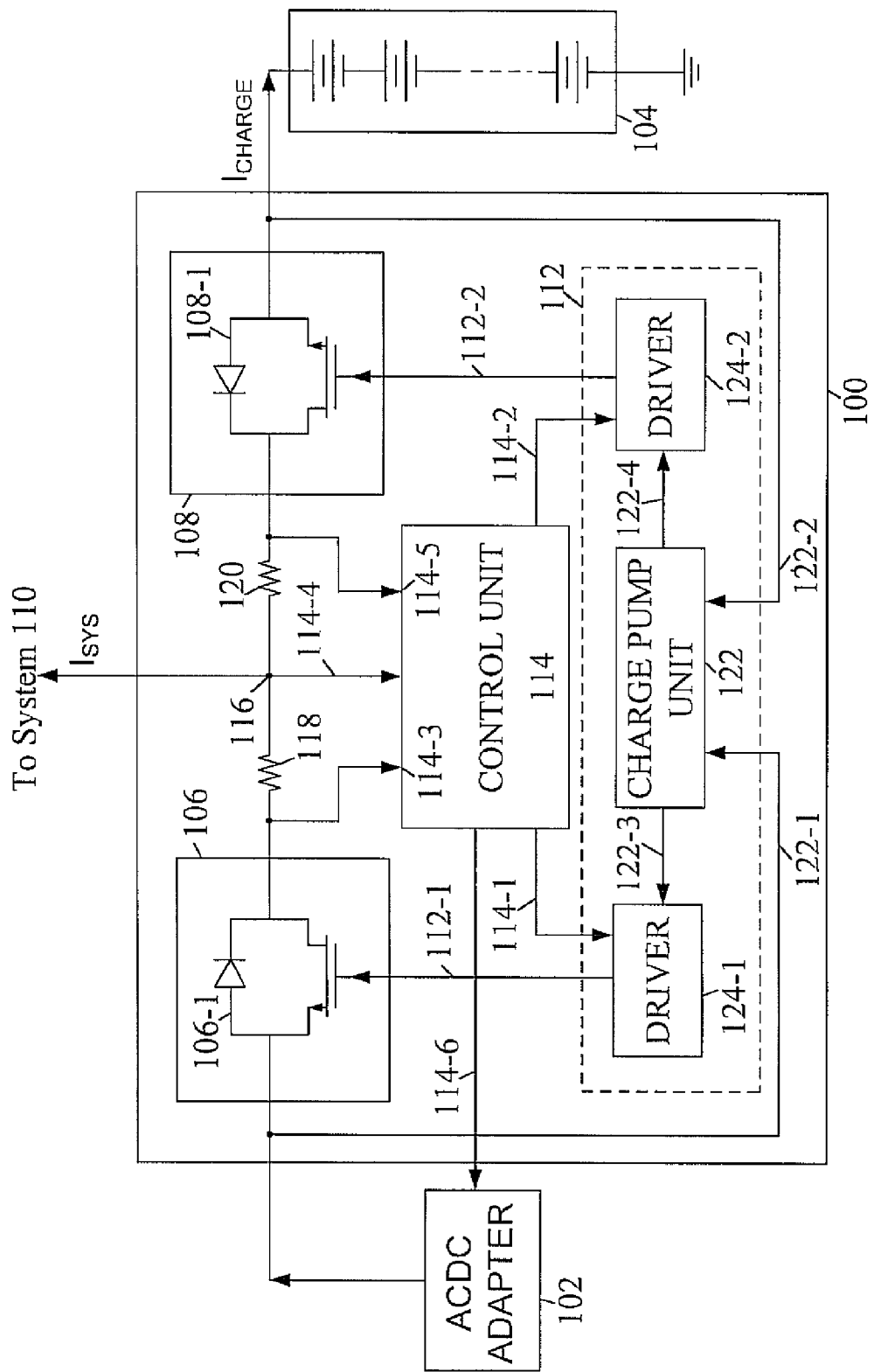
FIG. 1 illustrates a block diagram of an example of a power management system in accordance with one embodiment of the present invention.

FIG. 1 illustrates a block diagram of an example of a power management system 100 using NMOS switches and a corresponding driving circuit, in accordance with one embodiment of the present invention. The power management system 100 is operable for controlling power supply from a power source, e.g., an ACDC adapter 102 and/or a battery pack 104 to a system 110 via two NMOS switches 106 and 108, in one embodiment. As shown in FIG. 1, the power source for the system 110 can be an output controllable ACDC adapter 102 and the battery pack 104 which can be a rechargeable battery pack. However, the power source for the system 110 can be any of a variety of power sources, such as an AC/DC adapter with a fixed output, a DC "cigarette" type adapter, a battery pack, a rechargeable battery pack, etc. The battery pack 104 can include any type of rechargeable battery pack, such as lithium-ion, nickel-cadmium, or nickel-metal hydride batteries, or the like. The system 110 can be any variety of electronic devices which include, but are not limited to, a server computer, a desktop computer, a laptop computer, a cell phone, a personal digital assistant, etc.

In one embodiment, the power management system 100 is also operable for controlling power from the ACDC adapter 102 to charge the battery pack 104 via NMOS switches 106 and 108. The power management system 100 further includes a control unit 114 which is operable for monitoring the power supply status of the system 110 and the status of the battery pack 104, in one embodiment. Depending on the status of the system 110 and the battery pack 104, the control unit 114 selects a working mode for the power management system 100. Those modes include, but are not limited to: default mode, operation mode, charging operation mode, discharging mode, and heavy load mode. In default mode, both NMOS switches 106 and 108 are in off states, the system 110 and the power management system 100 are powered by either the ACDC adapter 102 or by the battery pack 104 (whichever has the higher output voltage), through one of the body diodes 106-1 or 108-1 that are intrinsically built into the respective switches, 106 and 108. In operation mode, the NMOS switch 106 can be switched on and the NMOS switch 108 can be switched off, thus the system 110 can be powered by the ACDC adapter 102 via the switch 106. In charging mode, both NMOS switches 106 and 108 are in on states, thus the ACDC adapter 102 can power the system 110 as well as charge the battery pack 104. In discharging mode, NMOS switch 106 is in off state and the NMOS switch 108 is in on state, thus the system 110 can draw power from the battery pack 104. In heavy load mode, both switches 106 and 108 are in on state, thus the ACDC adapter 102 and battery pack 104 can supply power simultaneously to the system 110 which has a heavy load (e.g., a power requirement of the system 110 is greater than the output power rating of the ACDC adapter 102).

In each working mode, the control unit 114 can generate control signals (e.g., switch control signals 114-1 and 114-2) to control the conductance status of NMOS switches 106 and 108, and to control an output (e.g., output current, output voltage, and/or output power) of the ACDC adapter 102. As previously stated herein, NMOS switches may need a driving signal having a voltage level greater than a voltage level at its source terminal. Thus, in one embodiment, a driving circuit 112 is provided to generate adequate driving signals to drive NMOS switches 106 and 108, such that NMOS switches 106 and 108 can be fully switched on and off.

In other embodiments, the power management system 100 can also control power supply from multiple power sources and/or multiple battery packs to the system 110 by using multiple NMOS switches and corresponding driving circuits. Furthermore, by using multiple NMOS switches, the power management system 100 can also charge multiple battery packs either simultaneously or individually.

As illustrated in FIG. 1, NMOS switches 106 and 108 are respectively coupled to a common node 116 via two sensing resistors 118 and 120. Power supply from ACDC adapter 102 and/or battery pack 104 is delivered to the system 110 via the common node 116, in one embodiment. The conductance status of NMOS switches 106 and 108 are controlled by two switch control signals 114-1 and 114-2 which are generated by the control unit 114, in one embodiment. In one embodiment, the driving circuit 112 is used to convert switch control signals 114-1 and 114-2 to appropriate driving signals 112-1 and 112-2, respectively.

The driving circuit 112 includes two drivers 124-1 and 124-2, which are respectively coupled between the control unit 114 and NMOS switches 106 and 108, in one embodiment. In addition to drivers 124-1 and 124-2, a charge pump unit 122 is also included in the driving circuit 112. The charge pump unit 122 has two input terminals 122-1 and 122-2 and two output terminals 122-3 and 122-4, in one embodiment. Input terminals 122-1 and 122-2 are respectively coupled to the output terminals of the ACDC adapter 102 and the battery pack 104. Output terminals 122-3 and 122-4 are respectively coupled to drivers 124-1 and 124-2. The charge pump unit 122 is operable for generating a voltage greater than a source voltage from the input terminals 122-1 and 122-2 of the charge pump unit 122. In one embodiment, the source voltages of the charge pump unit 122 can be the output voltage of the ACDC adapter 102 ($V_{ad}$) and/or the output voltage of the battery pack 104 ($V_{batt}$). Thus, the charge pump unit 122 can provide an output signal having a voltage level greater than that of $V_{ad}$ at the output terminal 122-3 to driver 124-1. Another output signal having a voltage level greater than that of $V_{batt}$ can also be output at the output terminal 122-4 and provided to driver 124-2. Thus, drivers 124-1 and 124-2 respectively receive the output signals of the charge pump unit 122, and generate a driving signal 112-1 (or 112-2) having an adequate output voltage level to fully switch on/off NMOS switches 106 and 108. Once driver 124-1 or 124-2 receives a switch control signal from the control unit 114, driver 124-1 or 124-2 can provide the driving signal 112-1 (or 112-2) having an adequate voltage level to drive NMOS switch 106 or 108.

Figure 2:
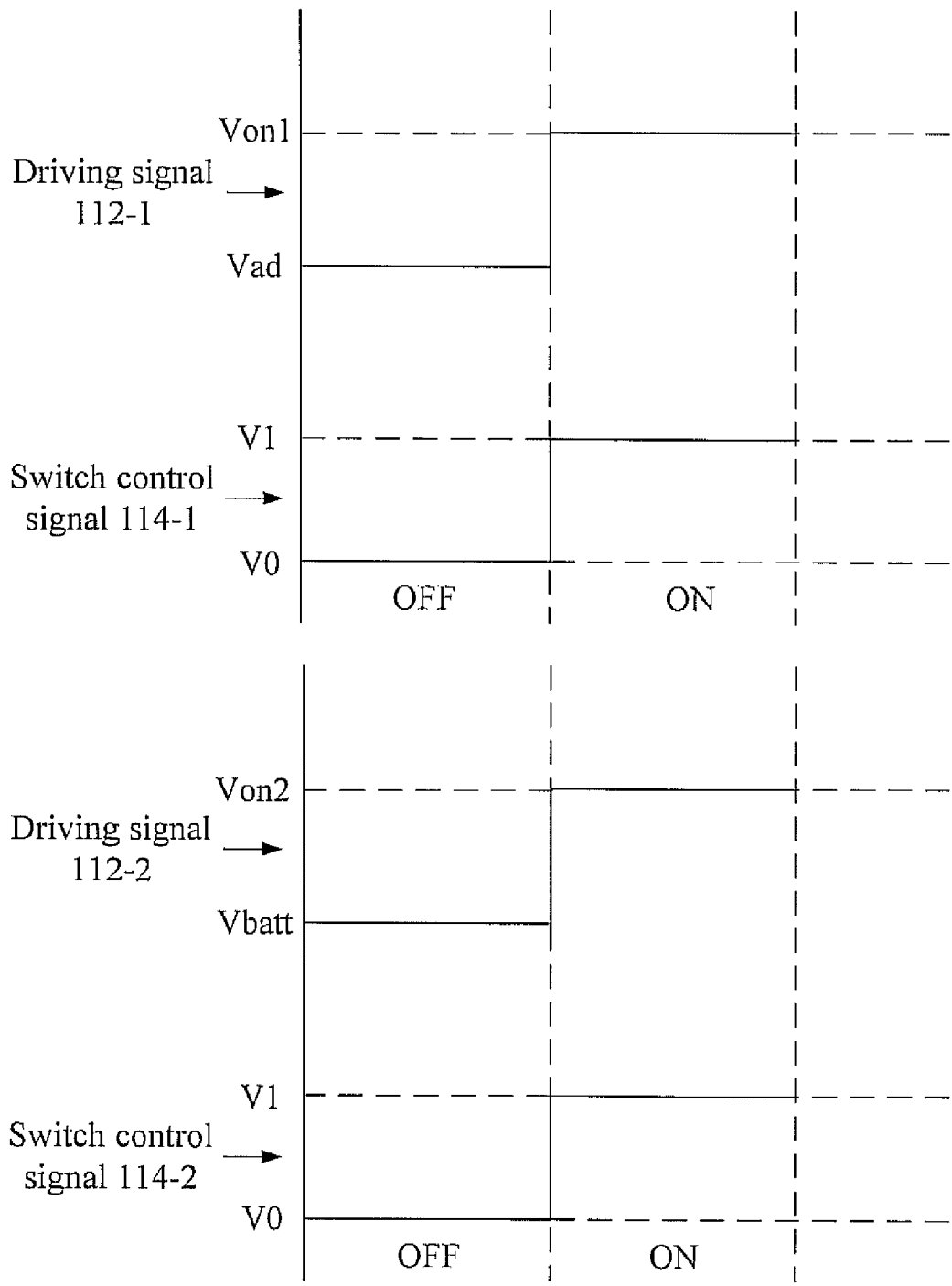
FIG. 2 illustrates examples of waveforms of switch control signals and driving signals in accordance with one embodiment of the present invention.

FIG. 2 shows examples of waveforms of switch control signals (114-1 and 114-2) and driving signals (112-1 and 112-2) in the power management system 100, in accordance with one embodiment of the present invention. As shown in the example of FIG. 2, the switch control signal 114-1 (or 114-2) has two voltage levels V0 (e.g., 0 volt) and V1 (e.g., 1.8 volts or 3.3 volts). In one embodiment, the control unit 114 generates a switch control signal 114-1 (or 114-2) having the voltage level V0 to instruct the driving circuit 112 to switch NMOS switch 106 (or 108) off. The control unit 114 can also generate a switch control signal 114-1 (or 114-2) having the voltage level V1 to instruct the driving circuit 112 to switch NMOS switch 106 (or 108) on. By using the driving circuit 112, the switch control signal 114-1 (or 114-2) can be converted to a driving signal 112-1 (or 112-2). As shown in FIG. 2, the driving signal 112-1 has two voltage levels $V_{ad}$ (e.g., 12V) and $V_{on1}$ (e.g., 18V). The driving signal 112-2 has two voltage levels $V_{batt}$ (e.g., 4.2 volts) and $V_{on2}$ (e.g., 10 volts). The NMOS switch 106 (or 108) is fully switched off if the driving signal 112-1 (or 112-2) has the voltage level $V_{ad}$ (or $V_{batt}$), in one embodiment. If the driving signal 112-1 (or 112-2) has the voltage level $V_{on1}$ (or $V_{on2}$), the NMOS switch 106 (or 108) is fully switched on, in one embodiment. Therefore, a combination of charge pump unit 122 and drivers 124-1 and 124-2 can provide adequate driving signals 112-1 and 112-2 to drive NMOS switches 106 and 108.

Returning to FIG. 1, the charge pump unit 122 can be implemented by two individual charge pumps, in one embodiment. For example, the input terminal 122-1 can be an input of a first charge pump which generates a signal having voltage level greater than $V_{ad}$ at the output terminal. The input terminal 122-2 can be an input of a second charge pump which generates a signal having voltage level greater than $V_{batt}$ at the output terminal 122-4. The charge pump unit 122 can also be a single charge pump which is operable for providing an output signal to the driver 124-1 or 124-2, in one embodiment. However, in another embodiment, multiple individual charge pumps can be used in the charge pump unit 122 to provide voltage signals to multiple drivers when multiple NMOS switches are employed in the power management system 100. In yet another embodiment, a single charge pump can be used in the charge pump unit 122 to alternately provide voltage signals to multiple drivers in a time-sharing way. In the time-sharing way, the multiple drivers can share the voltage signals provided by the single charge pump of the charge pump unit 122 by allocating one driver's idle time to service other drivers.

Before the power management system 100 is powered on, the power management system 100 is in the default mode, in which both NMOS switches 106 and 108 are in off states, in one embodiment. Once the power management system 100 is powered on, power can be delivered from the ACDC adapter 102 and/or from the battery pack 104 to the system 110. Although NMOS switches 106 and 108 are in off states, power can be delivered via body diodes 106-1 and 108-1 which are intrinsically built into the NMOS switches 106 and 108. As shown in FIG. 1, the body diode 106-1 has its anode intrinsically coupled to the source terminal of the NMOS switch 106 and its cathode coupled to the drain terminal of the NMOS switch 106. The body diode 108-1 also has its anode and cathode respectively coupled to the source terminal and drain terminal of the NMOS switch 108.

If the ACDC adapter 102 is not available, the system 110 as well as the power management system 100 can be powered on by the battery pack 104, in one embodiment. Under such circumstances, body diode 108-1 is forward biased and current generated by the battery pack 104 can flow through the body diode 108-1 to power the system 110, in one embodiment.

In one embodiment, the ACDC adapter 102 and the battery pack 104 may present simultaneously. Therefore, system 110 and the power management system 100 can be either powered by the ACDC adapter 102 or by the battery pack 104, in one embodiment. If $V_{ad}$ is greater than $V_{batt}$, the body diode 106-1 is forward biased and the body diode 108-1 is reverse biased. Consequently, current generated by the ACDC adapter 102 can flow through the body diode 106-1. Thus, system 110 and the power management system 100 can draw power from the ACDC adapter 102. Otherwise, in the default mode, if $V_{ad}$ is less than $V_{batt}$, the body diode 106-1 is reverse biased and the body diode 108-1 is forward biased, and the system 110 and the power management system 100 are powered by the battery pack 104. If $V_{ad}$ is equal to $V_{batt}$, the system 110 and the power management system 100 can randomly draw power from the ACDC adapter 102 and/or the battery pack 104.

Once the system 110 and the power management system 100 are powered on, the control unit 114 starts to manage power supply of the system 110 and the charging process of the battery pack 104. If the power management system 100 and the system 110 are powered on, under the control of the control unit 114, NMOS switches 106 and 108 can be fully switched on. Since an ON-state resistance of an NMOS switch can be relatively small, a voltage drop on a conducting NMOS switch may not exceed the conducting threshold of its body diode. Consequently, the body diode may not be conducting a significant current. Thus, after system 110 is powered on, current generated by ACDC adapter 102 and/or battery pack 104 may not flow through body diode 106-1 and/or 108-1.

The control unit 114 can firstly monitor the status of the ACDC adapter 102 and the battery pack 104, in one embodiment. As illustrated in FIG. 1, the control unit 114 has three sensing terminals 114-3, 114-4 and 114-5. In one embodiment, sensing terminal 114-3 is coupled to the drain terminal of NMOS switch 106. Sensing terminal 114-4 is coupled to the common node 116. Sensing terminal 114-5 is coupled to the drain terminal of NMOS switch 108. Via sensing terminals 114-3, 114-4 and 114-5, information such as $V_{ad}$, $V_{SYS}$ (input voltage of system 110), and $V_{batt}$ can be monitored. Furthermore, voltage drops on sensing resistors 118 and 120, and current which flows through sensing resistors 118 and 120, can also be obtained according to the monitored information from sensing terminals 114-3, 114-4 and 114-5. For example, the current which flows through the NMOS switch 106 can be measured by dividing the voltage drop on the sensing resistor 118 ($V_{ad}-V_{SYS}$) by the resistance of the sensing resistor 118.

According to the status of the ACDC adapter 102 and battery pack 104, the control unit 114 enters a specified working mode and generates multiple control signals, in one embodiment.

If the control unit 114 detects that the battery pack 104 is in an under-voltage condition, the control unit 114 can enter the charging operation mode, in which the ACDC adapter 102 powers the system 110 and charges the battery pack 104. In the charging operation mode, switch control signals 114-1 and 114-2 having the voltage level V1 are generated by the control unit 114. Upon receiving the switch control signals 114-1 and 114-2, driving signals 112-1 and 112-2 having voltage levels Von1 and Von2 are generated, which in turn switch on NMOS switches 106 and 108. Besides, an ACDC adapter control signal 114-6 can also be generated by the control unit 114. The ACDC adapter control signal 114-6 can adjust the output (e.g., output current, output voltage, and/or output power) of the ACDC adapter 102 to satisfy the power requirement of the system 110 and the charging power requirement of the battery pack 104, in one embodiment. In the charging operation mode, the output current of the ACDC adapter 102 flows through the NMOS switch 106 to the common node 116. Then, a charging current $I_{CHARGE}$ flows through the NMOS switch 108 to the battery pack 104 and a system current $I_{SYS}$ flows to the system 110.

The charging operation mode continues until the control unit 114 detects that the battery pack 104 is fully charged, in one embodiment. Then the control unit 114 enters the operation mode, in which the adapter 102 powers the system 110, in one embodiment. In the operation mode, the control unit 114 switches off NMOS switch 108 and switches on NMOS switch 106, such that a current equal to $I_{SYS}$ flows through the NMOS switch 106 to the system 110. The NMOS switch 108 is switched off, which in turn avoids an over-charge condition of the battery pack 104.

If the ACDC adapter 102 is not available, to maintain proper operation of the system 110 and the power management system 100, the power management device 100 enters a discharging mode, in one embodiment. In the discharging mode, the control unit 114 switches NMOS switch 106 off and NMOS switch 108 on. Thus, the system 110 can be powered by the battery pack 104.

In addition, if the power requirement of system 110 exceeds the designed power rating of the ACDC adapter 102, the power management system 110 enters the heavy load mode. In the heavy load mode, the control unit 114 can generate switch control signals 114-1 and 114-2 to switch on NMOS switches 106 and 108. Thus, the system 110 can be powered by the ACDC adapter 102 and the battery pack 104 simultaneously. In addition to the switch control signal 114-1 and 114-2, the control unit 114 can also adjust the output of the ACDC adapter 102 so as to provide enough power to maintain a proper operation of the system 110.

Advantageously, since an NMOS switch can have an ON-state resistance substantially smaller than a PMOS switch having the same size, the power dissipation caused by NMOS switches 106 and 108 can be reduced, in one embodiment. Power dissipation on each NMOS switch in each operation mode of the power management system 100 can be determined. For example, assume that an ON-state resistance of each NMOS switch is 10 milliohm (mΩ) and the power management system 100 works in the charging operation mode (e.g., $I_{SYS}$=4A, $I_{CHARGE}$=3A, and the output voltage of the ACDC adapter 102 is 12V). Then, power dissipation on NMOS switch 106 is approximately 0.49 W (10 mΩ×(4A+3A)²=0.49 W). Power dissipation on NMOS switch 108 is approximately 0.09 W (10 mΩ×(3A)²=0.09 W). Therefore, total power dissipation on NMOS switches 106 and 108 is approximately 0.58 W. Consequently, in the power management system 100, power dissipation on NMOS switches 106 and 108 only leads to a 0.7% decrease in the power transfer efficiency of the power management system 100, in one embodiment. Advantageously, NMOS switches can significantly increase the power transfer efficiency of the power management system 100 if multiple NMOS switches are used. Furthermore, the overall performance and stability can be enhanced since less power dissipates on NMOS switches.

Figure 3:
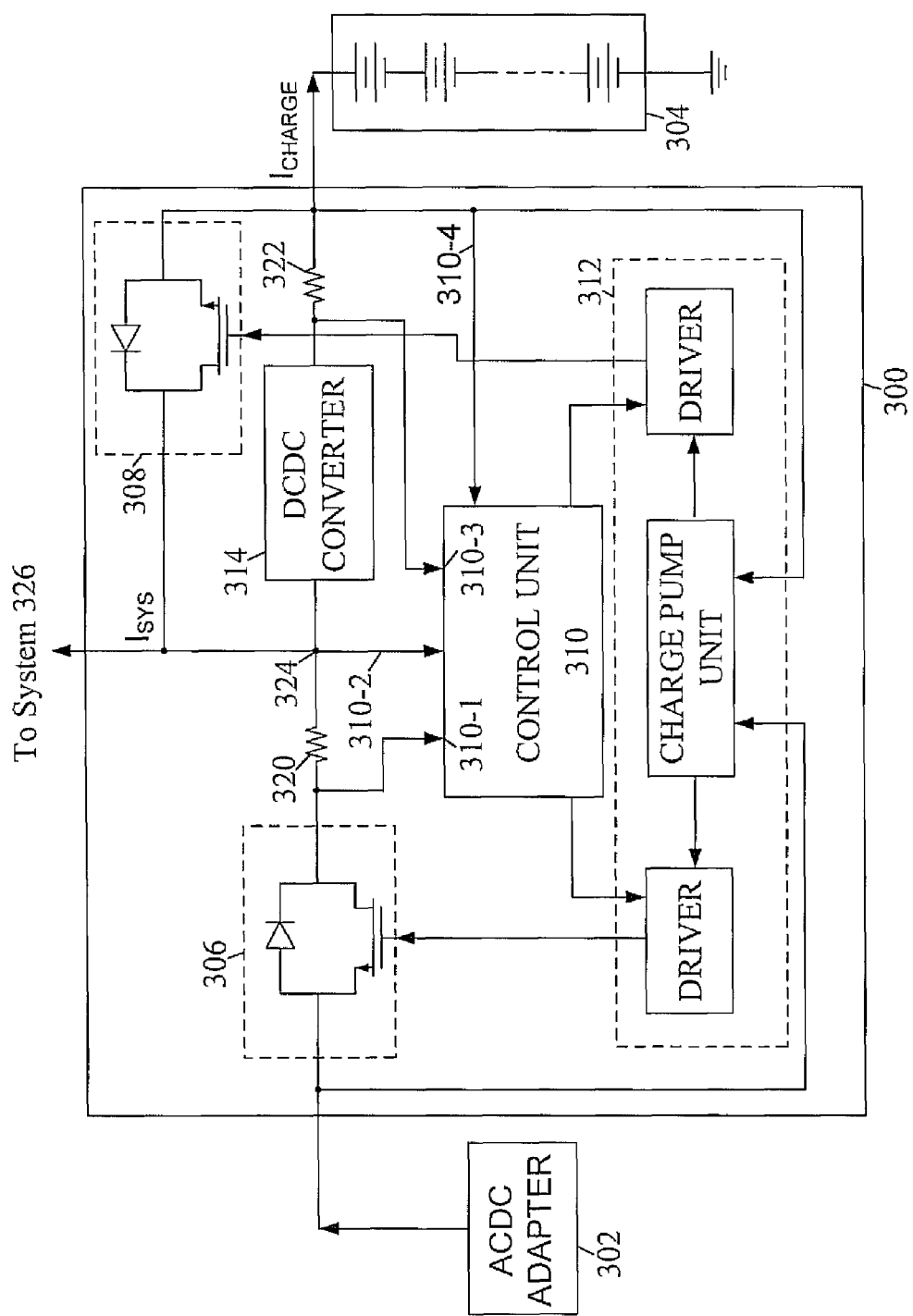
FIG. 3 illustrates a block diagram of an example of a power management system in accordance with another embodiment of the present invention.

FIG. 3 illustrates a block diagram of an example of a power management system 300 in which NMOS switches, a driving circuit and a DCDC converter are employed, according to another embodiment. The power management system 300 is operable for providing power to a system 326 as well as charging a battery pack 304 which can include various types of battery cells. As shown in FIG. 3, the power management system 300 includes two NMOS switches 306 and 308, a control unit 310, a driving circuit 312, and a DCDC converter 314, in one embodiment. NMOS switches 306 and 308 are operable for controlling power supply from a power source 302, e.g., an ACDC adapter and/or from a rechargeable battery pack 304, to a system 326, in one embodiment. The power management system 300 has similar functionalities as the power management system 100.

In one embodiment, the source terminal of the NMOS switch 306 is coupled to an output terminal of the power source 302. The drain terminal of the NMOS switch 306 is coupled to a common node 324 via a sensing resistor 320. A source terminal and a drain terminal of the NMOS switch 308 are respectively coupled to an output terminal of the rechargeable battery pack 304 and the common node 324. As shown in FIG. 3, the DCDC converter 314 is coupled between the common node 324 and a sensing resistor 322 having one end coupled to the output of the rechargeable battery pack 304, in one embodiment.

In one embodiment, the control unit 310 has four sensing terminals 310-1, 310-2, 310-3 and 310-4. As illustrated in FIG. 3, sensing terminals 310-1-310-4 are respectively coupled to the drain terminal of the NMOS switch 306, the common node 324, the output terminal of the DCDC converter 314, and the output terminal of rechargeable battery pack 304. By detecting status of the power source 302 and the rechargeable battery pack 304, the control unit 310 can control conductance status of NMOS switches 306 and 308, in one embodiment.

In one embodiment, if the control unit 310 detects that the rechargeable battery pack 304 is in an under-voltage condition, the control unit 310 can switch on NMOS switch 306 and switch off NMOS switch 308. The DCDC converter 314 receives the output voltage of the power source 302 and converts it to a voltage appropriate for charging the battery pack 304. The converted voltage can be further used to charge the rechargeable battery pack 304. The DCDC converter 314 can include, but is not limited to, a buck converter, a boost converter, or a buck-boost converter For example, if the output voltage level of the power source 302 is lower than a charging voltage required by the rechargeable battery pack 304, a boost converter can be used. A buck converter can also be used if the output voltage level of the power source 302 is greater than a maximum charging voltage of the battery pack 304. Advantageously, the power management system 300 can not only increase power transfer efficiency, but can also be flexible for being used with various power sources and rechargeable battery packs.

Figure 4:
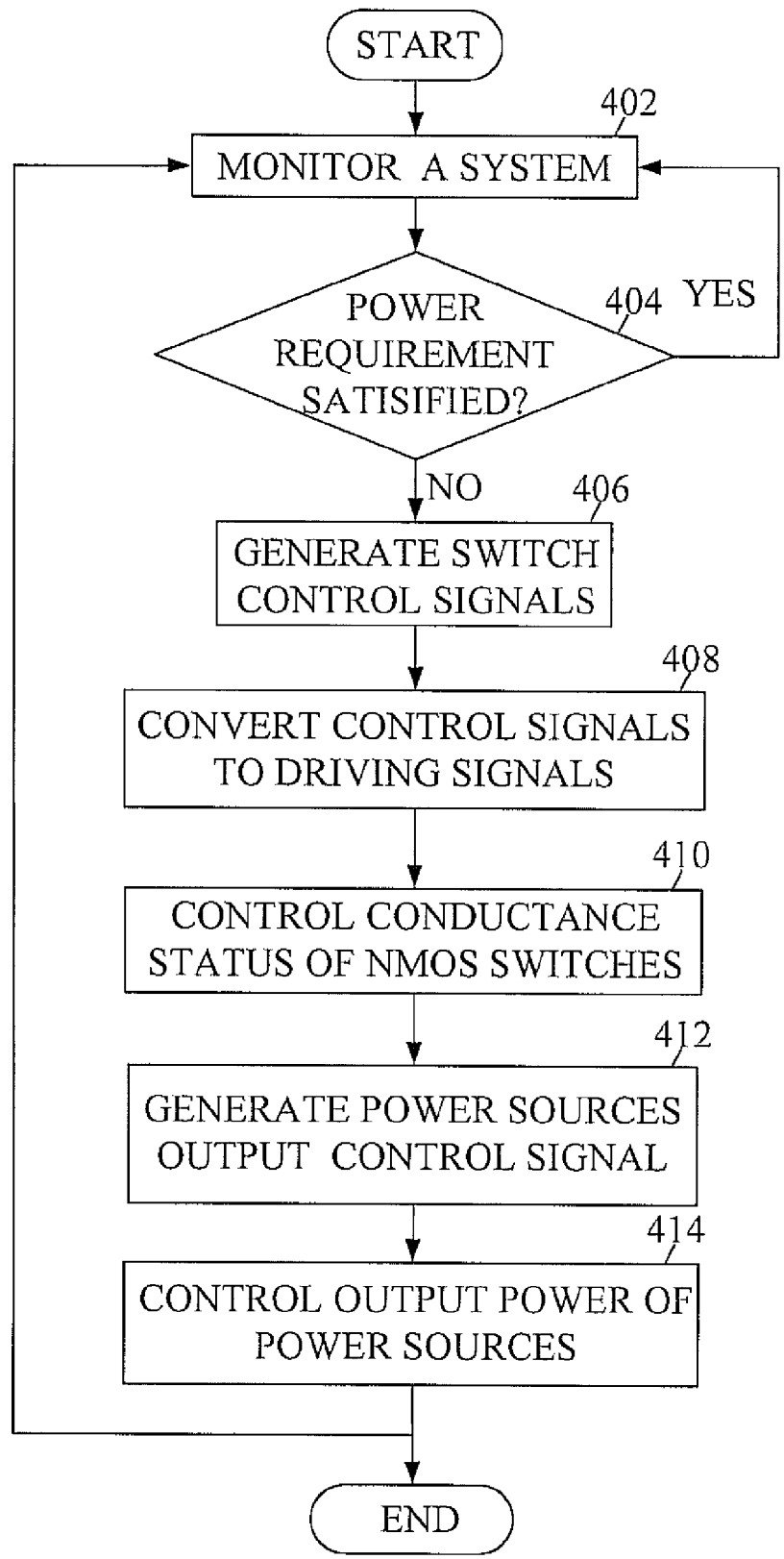
FIG. 4 illustrates a flowchart of a method of controlling power supply in accordance with another embodiment of the present invention

FIG. 4 illustrates a flowchart of a method for controlling power supply to a system according to one embodiment of the present invention. To control power supply to the system, the status of the system can be monitored, in block 402. In one embodiment, input current (or voltage) of the system and output voltage of a battery pack in the system can be monitored, in block 402. According to the monitored status of the system, a power requirement of the system can be determined. In block 404, if the power requirement of the system is satisfied, the status of the system can be further monitored. If the power requirement of the system is not satisfied, multiple control signals can be generated and/or adjusted, in block 406. In one embodiment, the aforementioned multiple control signals can be multiple NMOS switch control signals which can be used to control the conductance status of multiple NMOS switches. Each of the aforementioned multiple NMOS switches can be coupled between a power source and the system, in one embodiment. By using multiple NMOS switch control signals, one or more NMOS switches can be turned on so as to provide enough power to the system. The aforementioned multiple control signals can be further converted to driving signals which have adequate driving ability to fully switch on/off NMOS switches, in block 408. In one embodiment, to fully switch on/off an NMOS switch, an NMOS switch control signal can be converted to a driving voltage which has a voltage level greater than a source voltage of the NMOS switch. By using multiple driving signals, multiple NMOS switches of the system can be fully switched on/off so as to provide sufficient power to the system, in block 410. In one embodiment, multiple control signals can be converted to multiple driving signals by using a driving circuit which includes a charge pump unit. In addition to controlling the conductance status of multiple NMOS switches, multiple power source output control signals can be generated to control output (e.g., output power, output current or output voltage) of multiple power sources, in block 412. In one embodiment, a power source output control signal can adjust the output voltage of a power source. By using multiple output controls signals, output powers delivered to the system can be adjusted according to the power requirement of the system, in block 414.

While the foregoing description and drawings represent the embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A power management system comprising:
   a first Metal Oxide Semiconductor (MOS) switch coupled between a first power source and a node, said node coupled to a system load;
   a second MOS switch coupled between a second power source and said node;
   a driving circuit coupled to said first and second MOS switches and operable for generating a first driving voltage by boosting a voltage of said first power source, and for generating a second driving voltage by boosting a voltage of said second power source; and a control unit coupled to said driving circuit and operable for monitoring statuses of said first power source and said second power source, and for controlling said first driving voltage and said second driving voltage based on said statuses to selectively conduct said first MOS switch and said second MOS switch, wherein said control unit controls said first driving voltage and said second driving voltage to turn on both said first and second MOS switches if said statuses indicate said first power source is in an under-voltage condition, and wherein said second power source provides power to charge said first power source and to power said system load if said first and second MOS switches are both turned on.

2. The power management system as claimed in claim 1, wherein said control unit controls said first driving voltage and said second driving voltage to turn off said first switch and turn on said second switch if said statuses indicate both said first and second power sources are in normal conditions, and wherein said second power source but not said first power source provides power to said system load if said first switch is turned off and said second switch is turned on.

3. The power management system as claimed in claim 1, wherein said control unit controls said first driving voltage and said second driving voltage to turn on said first switch and turn off said second switch if said statuses indicate said second power source is in an absence state, and wherein said first power source but not said second power source provides power to said system load if said first switch is turned on and said second switch is turned off.

4. The power management system as claimed in claim 1, wherein said control unit further monitors statuses of said system load, wherein said control unit controls said first driving voltage and said second driving voltage to turn on both said first and second switches if said statuses of said system load indicate a heavy load that exceeds power output from said second power source, and wherein both said first and second power sources provide power to said system load if both said first and second switches are turned on.

5. The power management system as claimed in claim 1, wherein said first and second MOS transistors are N-channel Metal Oxide Semiconductor (NMOS) transistors.

6. The power management system as claimed in claim 1, wherein said control unit monitors said statuses by detecting voltages of said first power source and said second power source.

7. A method for driving a first Metal Oxide Semiconductor (MOS) switch and a second MOS switch, said first MOS switch coupled between a first power source and a system load, and said second MOS switch coupled between a second power source and said system load, said method comprising:
generating a first driving voltage by boosting a voltage of said first power source;
generating a second driving voltage by boosting a voltage of said second power source;
monitoring statuses of said first power source and said second power source;
selecting an operation mode from a plurality of operation modes based on said statuses;
controlling said first driving voltage and said second driving voltage in response to said operation mode to selectively conduct said first MOS switch and said second MOS switch;
selecting a charging mode from said operation modes if said statuses indicate said first power source is in an under-voltage condition; and
turning on both said first and second MOS switches in response to said charging mode to deliver power from said second power source to said first power source and to deliver power from said second power source to said system load.

8. The method as claimed in claim 7, further comprising:
selecting said operation mode if said statuses indicate both said first power source and said second power source are in normal conditions; and
turning off said first switch and turning on said second switch in response to selecting said operation mode, such that said second power source but not said first power source provides power to said system load.

9. The method as claimed in claim 7, further comprising:
selecting a discharging mode if said statuses indicate said second power source is in an absence state; and
turning on said first switch and turning off said second switch, such that said first power source but not said second power source provides power to said system load.

10. The method as claimed in claim 7, further comprising:
monitoring statuses of said system load;
selecting a heavy load mode if said statuses of said system load indicate said system load is a heavy load that exceeds power output from said second power source; and
turning on both said first and second switches, such that both said first and second power sources provide power to said system load.

11. The power management system as claimed in claim 1, wherein a current flows from said first power source through said first MOS switch and said second MOS switch to said second power source if both said first and second switches are turned on when said statuses indicate said first power source is in an under-voltage condition.

12. The power management system as claimed in claim 4, wherein a first current flows from said first power source through said first MOS switch to said system load and a second current flows from said second power source through said second MOS switch to said system load if both said first and second switches are turned on when said statuses indicate that said system load is said heavy load.

13. The method as claimed in claim 7, wherein a current flows from said first power source through said first MOS switch and said second MOS switch to said second power source if both said first and second switches are turned on in said charging mode.

14. The power management system as claimed in claim 10, wherein a first current flows from said first power source through said first MOS switch to said system load and a second current flows from said second power source through said second MOS switch to said system load if both said first and second switches are turned on in said heavy load mode.

* * * * *